United States Patent
Feng

(10) Patent No.: US 9,865,623 B2
(45) Date of Patent: Jan. 9, 2018

(54) ARRAY SUBSTRATE AND MANUFACTURING METHOD THEREOF, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Wei Feng, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/766,831

(22) PCT Filed: Dec. 18, 2014

(86) PCT No.: PCT/CN2014/094223
§ 371 (c)(1),
(2) Date: Aug. 10, 2015

(87) PCT Pub. No.: WO2016/029601
PCT Pub. Date: Mar. 3, 2016

(65) Prior Publication Data
US 2016/0254275 A1    Sep. 1, 2016

(30) Foreign Application Priority Data
Aug. 28, 2014  (CN) .......................... 2014 1 0431286

(51) Int. Cl.
*H01L 27/12* (2006.01)
*H01L 33/42* (2010.01)
(Continued)

(52) U.S. Cl.
CPC ...... *H01L 27/124* (2013.01); *G02F 1/136286* (2013.01); *H01L 27/1259* (2013.01); *H01L 33/42* (2013.01); *G02F 1/1345* (2013.01)

(58) Field of Classification Search
None
See application file for complete search history.

(56) References Cited

U.S. PATENT DOCUMENTS

| | | | |
|---|---|---|---|
| 2008/0024416 | A1 | 1/2008 | Onogi et al. |
| 2010/0134710 | A1 | 6/2010 | Ishitani et al. |

(Continued)

FOREIGN PATENT DOCUMENTS

| | | |
|---|---|---|
| CN | 101114086 A | 1/2008 |
| CN | 101750821 A | 6/2010 |

(Continued)

OTHER PUBLICATIONS

International Search Report with English translation and Written Opinion both dated May 29, 2015; PCT/CN2014/094223.

(Continued)

Primary Examiner — Daniel Whalen
(74) Attorney, Agent, or Firm — Ladas & Parry LLP; Loren K. Thompson

(57) ABSTRACT

An array substrate, a manufacturing method thereof, and a display device are provided. The array substrate includes a peripheral common electrode line for supplying a common voltage and a plurality of sub-pixels. The array substrate further includes first connection portions and second connection portions; the first connection portions extend along a first direction and are provided between the peripheral common electrode line and common electrodes of the sub-pixels adjacent to a side of the peripheral common electrode line along a second direction, for electrically connecting the peripheral common electrode line with the common elec- (Continued)

trodes of the sub-pixels adjacent to the side of the peripheral common electrode line along the second direction; and the second connection portions extend long the first direction and are provided between the common electrodes of adjacent sub-pixels along the first direction, for electrically connecting the common electrodes of the adjacent sub-pixels along the first direction.

10 Claims, 9 Drawing Sheets

(51) Int. Cl.
    *G02F 1/1362*     (2006.01)
    *G02F 1/1345*     (2006.01)

(56) References Cited

U.S. PATENT DOCUMENTS

| | | |
|---|---|---|
| 2011/0063538 A1 | 3/2011 | Xie et al. |
| 2012/0200819 A1 | 8/2012 | Huang et al. |
| 2015/0062453 A1* | 3/2015 | Kim .................. G02F 1/136286 349/12 |

FOREIGN PATENT DOCUMENTS

| | | |
|---|---|---|
| CN | 102023422 A | 4/2011 |
| CN | 202533686 U | 11/2012 |
| CN | 103135296 A | 6/2013 |
| CN | 103353695 A | 10/2013 |
| CN | 104216183 A | 12/2014 |
| KR | 20120089937 A | 8/2012 |

OTHER PUBLICATIONS

First Chinese Office Action dated Jun. 20, 2016; Appln. No. 201410431286.9.
Second Chinese Office Action dated Mar. 20, 2017, Appln. No. 201410431286.9.

* cited by examiner

PRIOR ART

ARRAY SUBSTRATE AND MANUFACTURING METHOD THEREOF, AND DISPLAY DEVICE

TECHNICAL FIELD

Embodiments of the disclosure relate to an array substrate and a manufacturing method thereof, and a display device.

BACKGROUND

As a kind of flat panel display device, Thin Film Transistor Liquid Crystal Display (TFT-LCD) is increasingly used by people due to its advantages such as small size, low power consumption, no radiation, relatively low production cost and the like.

The TFT-LCD comprises an array substrate and a color filter substrate. A liquid crystal layer is provided between the array substrate and the color filter substrate, and an electric field is generated in the liquid crystal layer by respectively applying voltages on a pixel electrode provided on the array substrate and on a common electrode provided on the color filter substrate or the array substrate. Then, a transmittance of light passing through the liquid crystal layer is adjusted by adjusting the magnitude of the electric field, so that expected images are displayed.

In the case that the above common electrode and pixel electrode are both provided on the array substrate, the common electrode and the pixel electrode may be according to different layers; and the electrode in the upper layer is an electrode comprising slits and the electrode in the lower layer is a plate-shaped electrode (or an electrode comprising slits). The display device constructed by using the above array substrate is a display device of Advanced-Super Dimensional Switching (AD-SDS, and ADS in short) type. For example, as shown in FIG. 1, the common electrode 10a is the plate-shaped electrode, the pixel electrode 11a is the electrode comprising slits, and the pixel electrode 11a is provided above the common electrode 10a. In the above display device of ADS type, a multi-dimensional electric field is formed with both an electric field generated at edges of slits (the slits of the pixel electrode 11a) in a same plane and an electric field generated between the electrode comprising slits (the pixel electrode 11a) and a plate-like electrode (the common electrode 10a), so that liquid crystal molecules at all orientations, which are located directly above the electrodes or between the slits in the liquid crystal layer, can be rotated. In this way, the work efficiency of liquid crystal can be enhanced and the light transmittance can be increased. The display device of ADS type has advantages of high image quality, high resolution, high transmittance, low power consumption, wide viewing angle, and the like.

In order that a common voltage is input to the common electrode 10a of each sub-pixel 1a, a common electrode line 101a parallel to a gate line 100a is generally provided on at least one side of the gate line 100a and is connected to the common electrodes 10a of the sub-pixels 1a in a same row. The common voltage is supplied to the common electrode 10a by the above common electrode line 101a.

However, a portion of a display region of the above sub-pixel 1a is occupied by the common electrode line 101a, thus the aperture ratio of the display device is reduced and the display effect of the display device is reduced.

SUMMARY

According to the embodiments of the present disclosure, an array substrate is provided. The array substrate comprises a peripheral common electrode line for supplying a common voltage and a plurality of sub-pixels. The array substrate further comprises a plurality of first connection portions and second connection portions; the first connection portions extend along a first direction and are provided between the peripheral common electrode line and common electrodes of the sub-pixels adjacent to a side of the peripheral common electrode line along a second direction, for electrically connecting the peripheral common electrode line with the common electrodes of the sub-pixels adjacent to the side of the peripheral common electrode line along the second direction; and the second connection portions extend long the first direction and are provided between the common electrodes of adjacent sub-pixels along the first direction, for electrically connecting the common electrodes of the adjacent sub-pixels along the first direction.

According to the embodiments of the present disclosure, a display device is provided. The display device comprises the array substrate as described above.

According to the embodiments of the present disclosure, a manufacturing method of an array substrate is provided. The manufacturing method comprises a process of forming a peripheral common electrode line for supplying a common voltage and a plurality of sub-pixels. The method further comprises: forming first connection portions which extend along a first direction and are provided between the peripheral common electrode line and common electrodes of the sub-pixels adjacent to a side of the peripheral common electrode line along a second direction, for electrically connecting the peripheral common electrode line with the common electrodes of the sub-pixels adjacent to the side of the peripheral common electrode line along the second direction; and forming second connection portions which extend along the first direction and are provided between the common electrodes of adjacent sub-pixels along the first direction, for electrically connecting the common electrodes of the adjacent sub-pixels along the first direction.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
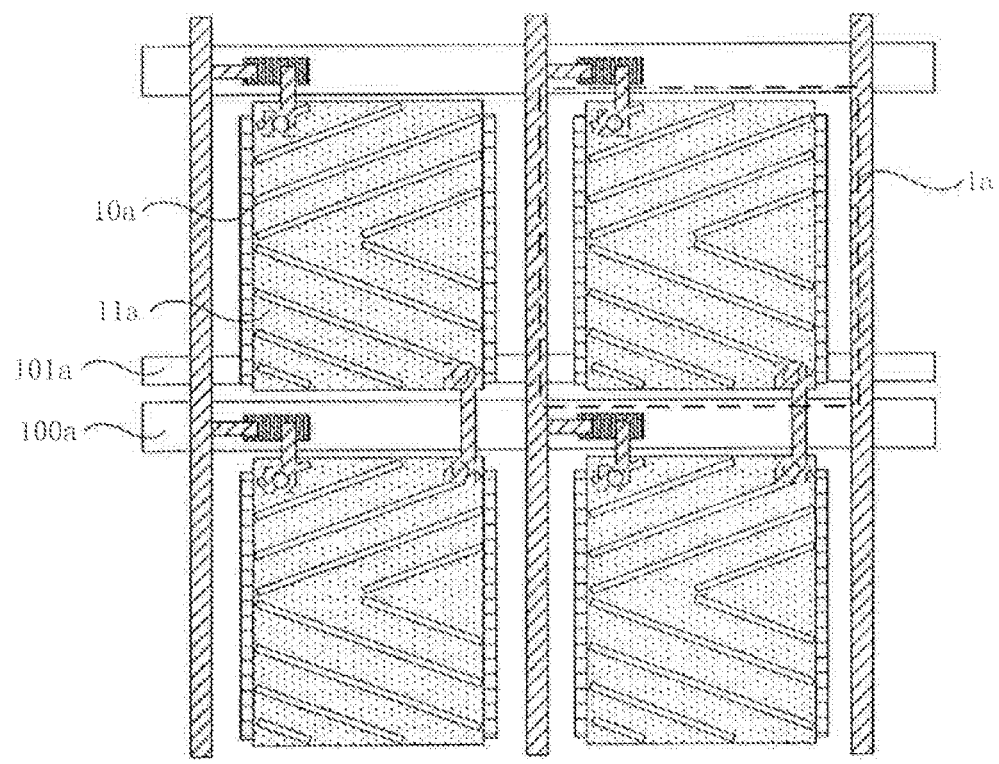
FIG. 1 is a structural schematic view illustrating an array substrate according to one technique.
Figure 2:
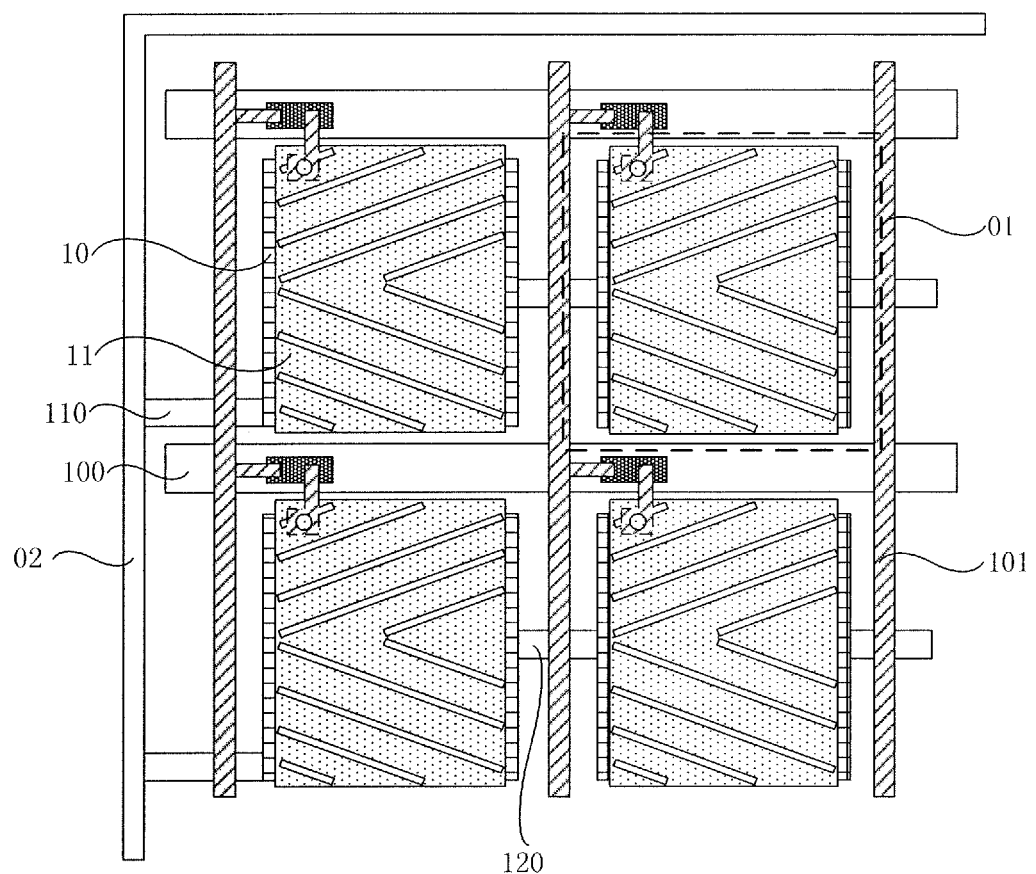
FIG. 2 is a structural schematic view illustrating an array substrate according to the embodiments of the present disclosure.

Embodiments of the present disclosure provide an array substrate. As shown in FIG. 2, the array substrate comprises a display region and a non-display region provided outside the display region. A plurality of gate lines 100 and a plurality of data lines 101 are provided in the display region to intersect with each other to form a plurality of sub-pixels 01 arranged in a matrix form; and a peripheral common electrode line 02 for supplying a common voltage Vcom is provided in the non-display region. For example, the array substrate further comprises a plurality of first connection portions 110 and a plurality of second connection portions 120.

The first connection portions 110 are provided between the peripheral common electrode line 02 and common electrodes 10 of the sub-pixels 01 adjacent to a side of the peripheral common electrode line 02 so as to electrically connect the peripheral common electrode line 02 with the above common electrodes 10 (i.e., the common electrodes 10 of the sub-pixels 01 adjacent to the side of the peripheral common electrode line 02). For example, the first connection portions 110 extend along a first direction, and the first connection portions 110 are provided between the peripheral common electrode line 02 and the common electrodes 10 of the sub-pixels 01 adjacent to the side of the peripheral common electrode line 02 along a second direction.

The second connection portions 120 are provided between the common electrodes of adjacent sub-pixels 01 to electrically connect the common electrodes 10 of the adjacent sub-pixels with each other. For example, the second connection portions extend along the first direction, and the second connection portions 120 are provided between the common electrodes of adjacent sub-pixels 01 along the first direction to electrically connect the common electrodes 10 of the adjacent sub-pixels along the first direction with each other.

It should be noted that, the above first direction may be a direction parallel to the gate lines 100, and a second direction may be a direction perpendicular to the gate lines 100, i.e., the second direction is a direction parallel to the data lines 101; or, the first direction may be the direction parallel to the data lines 101, and the second direction may be the direction parallel to the gate lines 100. The first direction and the second direction are not limited by the embodiments of the present disclosure. For simplicity, all description is made in the following embodiments by taking the case that the first direction is the direction parallel to the gate lines 100 and the second direction is the direction parallel to the data lines 101 as an example.

It should be noted that, the peripheral common electrode line 02 is provided to surround the display region of the array substrate, so the sub-pixels 01 adjacent to the side of the peripheral common electrode line 02 refers to the sub-pixels 01 provided on four edges of the display region of the array substrate and being closest to the peripheral common electrode line 02 among all sub-pixels 01 of the array substrate. Since the common electrodes 10 of the sub-pixels 01 adjacent to the side of the peripheral common electrode line 02 are electrically connected with the peripheral common electrode line 02 by the first connection portions 110, the common voltage Vcom input by the peripheral common electrode line 02 is received by the common electrodes 10 of the sub-pixels 01 adjacent to the side of the peripheral common electrode line 02.

It should be noted that, the sub-pixels 01 further comprise pixel electrodes 11. For example, the layer in which the common electrodes 10 are provided is different from the layer in which the pixel electrodes 11 are provided. Upper and lower positions of the common electrodes 10 and the pixel electrodes 11 among a plurality of stacked layers on the array substrate are not limited in the embodiments of the present disclosure. For simplicity, all description is made in the following embodiments by taking the following case as an example: the common electrodes 10 are provided in a lowermost layer among the plurality of stacked layers on the array substrate, the pixel electrodes 11 are provided in an uppermost layer among the plurality of stacked layers on the array substrate, each of the common electrodes 10 is a plate-shaped electrode and each of the pixel electrodes 11 is a slit-shaped electrode comprising a plurality of slits.

It should be noted that, upper and lower positions of the first connection portions 110 and the second connection portions 120 at a side of the sub-pixels 01 along the second direction are not limited in the embodiments of the present disclosure. For example, as for the sub-pixels 01 in a first row, the first connection portions 110 or the second connection portions 120 may be provided on uppermost position of the side of the sub-pixels 01 along the second direction, or may be provided at center position of the side of the sub-pixels 01 along the second direction, or may be provided on lowermost position of the side of the sub-pixels 01 along the second direction. In FIG. 2, the case that the first connection portions 110 are provided on the lowermost position of the side the sub-pixels 01 along the second direction and the second connection portions 120 are provided at the center position of the side of the sub-pixels 01 along the second direction is illustrated as an example.

It should be noted that, a width of each of the first connection portions 110 along the second direction or a width of each of the second connection portions 120 along the second direction (i.e., a longitudinal dimension of the first connection portions 110 or a longitudinal dimension of the second connection portions 120) is reduced as much as possible provided that stability of electrical connections between the common electrodes 10 of adjacent sub-pixels 01 and stability of electrical connections between the common electrodes 10 and the peripheral common electrode line 02 are ensured. For example, the width of each of the first connection portions 110 along the second direction and/or the width of each of the second connection portions 120 along the second direction are $\frac{1}{40}$ to $\frac{1}{15}$ of the width of each of the sub-pixels 10 along the second direction. Accordingly, the larger the width of sub-pixels 10 along the second direction is, the greater the width of the first connection portions 110 along the second direction or the width of the second connection portions 120 along the second direction is, and vice versa.

It should be noted that, in order that the first connection portions 110 electrically connect the peripheral common electrode line 02 with the common electrodes 10, the first connection portions 110 for example are extended to the peripheral common electrode line 02 and are connected with the peripheral common electrode line 02, as shown in FIG. 2.

Figure 5:
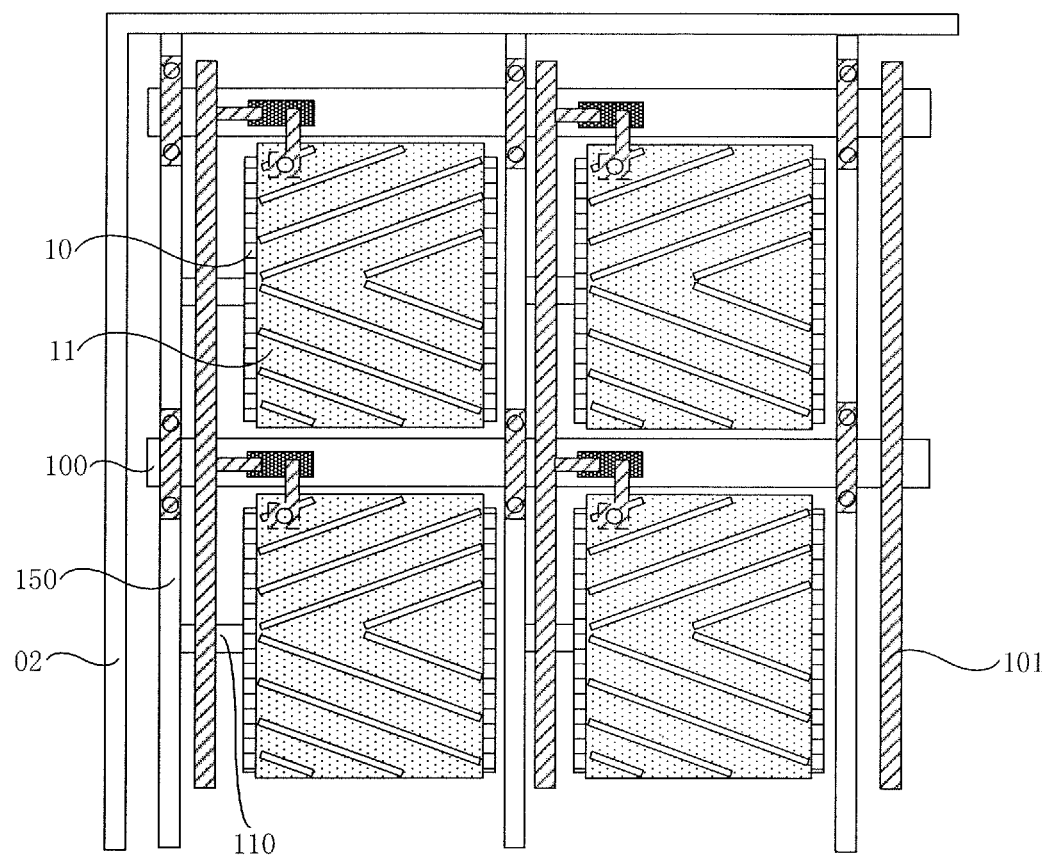
FIG. 5 is a structural schematic view illustrating yet another array substrate according to the embodiments of the present disclosure.

Alternatively, in order that the first connection portions 110 electrically connect the peripheral common electrode line 02 with the common electrodes 10, the array substrate for example further comprises additional lines 150 as shown in FIG. 5, the additional lines 150 extend along the second direction (i.e., the direction parallel to the data lines), are provided between the peripheral common electrode line 02 and the common electrodes 10 of the sub-pixels 01 adjacent to the side of the peripheral common electrode line 02 along the second direction and are connected with the peripheral common electrode line 02. The first connection portions 110 are connected with the additional lines 150 to achieve the purpose of electrically connecting the peripheral common electrode line 02 with the common electrodes 10.

For example, via boles are formed on the additional lines 150 of adjacent sub-pixels 01 along the second direction, and a conductive connection line is formed at the via holes so that the additional lines 150 of the adjacent sub-pixels 01 along the second direction are electrically connected with each other. For example, the conductive connection line is formed of a transparent conductive material or a metal material.

It should be noted that, the common electrodes 10 and the additional lines 150 are formed respectively by using normal masks (i.e. single-tone mask) so that the common electrode 10 and the additional line 150 in the same sub-pixel 01 have no overlapping portion. In this way, the additional lines 150 will be provided in the non-display region of the sub-pixel 01, thereby increasing the aperture ratio of the display device.

Further, in order to improve electric conductivity of the first connection portions 110 and the additional lines 150, the first connection portions 110 and the additional lines 150 for example are made of a metal material. For example, the first connection portions 110 and the additional lines 150 are formed in a same layer with a same material as the gate line 100. Since a gate metal layer for forming the gate lines 100 is formed of a metal material commonly used in the art, a process for producing the first connection portions 110 and the additional lines 150 can be readily realized. Moreover, in the case that the first connection portions 110 and the additional lines 150 are formed in the same layer with the same material as the gate lines 100, the first connection portions 110 and the additional lines 150 for example are formed at the same time of forming the gate lines 100 by using a single patterning process.

What is described above is only an example of electrically connecting the peripheral common electrode line 02 with the common electrodes 10 by the first connection portions 110, and other electrical connection manners will not be described in detail here.

The array substrate according to the embodiments of the present disclosure comprises the peripheral common electrode line for supplying the common voltage and the plurality of sub-pixels, and further comprises the plurality of first connection portions and second connection portions. The first connection portions extend along the first direction and are provided between the peripheral common electrode line and the common electrodes of the sub-pixels adjacent to the side of the peripheral common electrode line along the second direction (the first connection portions are provided in the non-display region of the sub-pixels), so as to electrically connect the peripheral common electrode line with the common electrodes. Moreover, the second connection portions are provided between common electrodes of the adjacent sub-pixels along the first direction (the second connection portions are provided in the non-display region of the sub-pixels), so as to electrically connect the common electrodes of the adjacent sub-pixels. In this way, the common electrodes of the adjacent sub-pixels along the first direction are electrically connected through the second connection portions, and the common electrodes adjacent to the side of the peripheral common electrode line along the second direction are electrically connected with the peripheral common electrode line by the first connection portions; so the peripheral common electrode line can provide the common voltage to all common electrodes by the first connection portions and the second connection portions to achieve the purpose of applying the common voltage to the common electrodes and controlling the deflection of liquid crystal molecules in the liquid crystal layer. Meanwhile, since both the above first connection portions and second connection portions are disposed in the non-display region of the sub-pixels, the aperture ratio of the display device will not be decreased. Accordingly, the display device formed by using the above array substrate can increase the aperture ratio and improve the product quality and display effect while applying the common voltage to the common electrodes.

The common electrodes 10 for example are made of a transparent conductive material, such as Indium Tin Oxide (ITO), Indium Zinc Oxide and the like. Since electric conductivity of the transparent conductive material is less than that of a metal material, the first connection portions 110 and the second connection portions 120 for example are made of the metal material to improve the electric connections between the common electrodes 10 and the peripheral common electrode line 02 and the electric connections between the common electrodes 10 of adjacent sub-pixels 01. For example, the first connection portions 110 and the second connection portions 120 are formed in the same layer with the same material as the gate lines 100. Since the gate metal layer for forming the gate lines 100 is formed of the metal material commonly used in the art, the process for producing the first connection portions 110 and the second connection portions 120 can be readily realized. Moreover, in the case that the first connection portions 110 and the second connection portions 120 are formed in the same layer with the same material as the gate lines 100, the first connection portions 110 and the second connection portions 120 are formed at the same time of forming the gate lines 100 by using a single patterning process.

It should be noted that the patterning process in the embodiments of the present disclosure may be any process for forming a predetermined pattern such as photolithographic process, printing process, inkjeting process and the like; the photolithographic process refers to a process including film formation, exposure, developing and the like to form the predetermined pattern by using photoresist, mask, and exposure machine, etc. The patterning process may be selected according to a structure to be formed in the embodiments of the present disclosure. A single patterning process in the embodiments of the present disclosure refers to a process of forming the predetermined pattern through one exposure by using one mask.

As described above, the common voltage Vcom supplied by the peripheral common electrode line 02 is input into all common electrodes 10 on the array substrate by the first connection portions 110 and the second connection portions 120. However, since both the first connection portions 110 and the second connection portions 120 input the common voltage Vcom into the common electrodes 10 along the first direction, voltages input to different regions of the common electrodes 10 may be uneven. For example, voltages input to regions closer to the first connection portions 110 or the second connection portions 120 are larger while voltages input to regions farther from the first connection portions 110 or second connection portions 120 are smaller. As such, during the liquid crystal molecules are controlled to deflect, the liquid crystal molecules that should be deflected by a same angle may be defected by different angles due to unevenness of the electric field between the common electrodes 10 and the pixel electrodes 11, which therefore will cause defects such as uneven brightness or flicker of the displayed images.

In order to solve this problem, the embodiments of the present disclosure further provide technical solutions below.

Figure 3A:
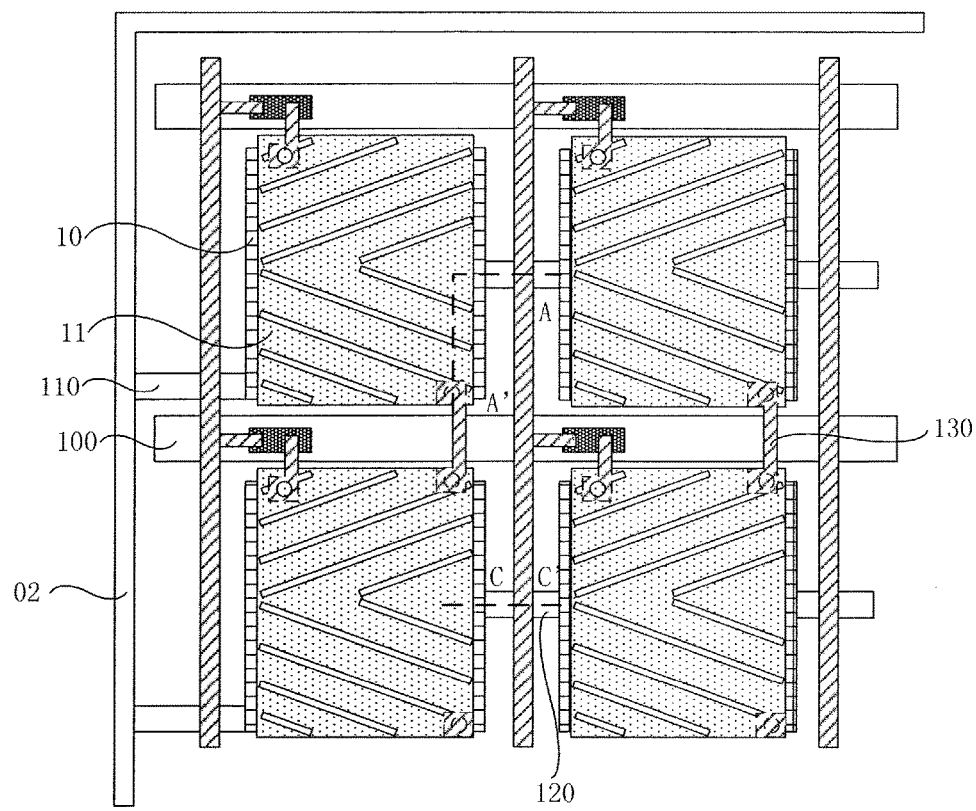
FIG. 3a is a structural schematic view illustrating another array substrate according to the embodiments of the present disclosure.

As shown in FIG. 3a, the array substrate further comprises a plurality of third connection portions 130 provided between adjacent sub-pixels 01 along the second direction for electrically connecting the common electrodes 10 of the adjacent sub-pixels 01 along the second direction.

For example, the third connection portions 130 are made of a transparent conductive material. In the case that the third connection portions 130 are made of the transparent conductive material, via holes (not shown in the diagram) for example formed at positions on the pixel electrodes 11 corresponding to the third connection portions 130, and then the third connection portions 130 are made by using the transparent conductive material so that the third connection portions 130 electrically connect the common electrodes 10 of adjacent sub-pixels 01 along the second direction through the above via holes. Furthermore, since the pixel electrodes 11 are also made of a transparent conductive material, an insulating layer is formed between the third connection portions 130 and the pixel electrodes 11. Furthermore, in order to prevent the pixel electrodes from being electrically connected with the third connection portions 130 at the via holes, portions of the pixel electrodes around the via holes are removed.

Alternatively, in order to improve the electric conductivity of the third connection portions 130, the third connection portions 130 are made of a metal material.

Figure 3B:
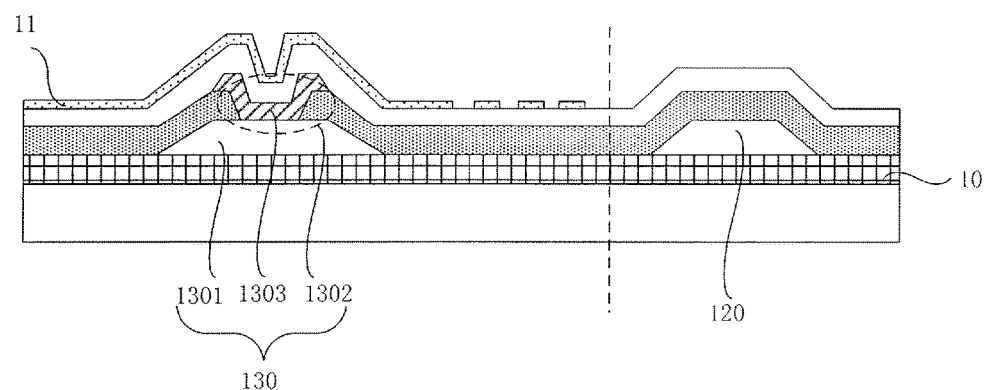
FIG. 3b is a partial structural cross-sectional view illustrating the another array substrate according to the embodiments of the present disclosure.

For example, the array substrate comprises the data lines 101 as described above. As shown in FIG. 3b (a sectional view taken along A-A' of FIG. 3a), the third connection portions 130 for example comprise: first islands 1301 provided on the common electrodes 10 of the adjacent sub-pixels along the second direction; first via holes 1302 provided on the first islands 1301; and first bridge lines 1303.

For example, the first islands 1301 are formed in the same layer with the same material as the gate lines 100. Specifically, the first islands 1301 and the second connection portions 120 are formed at the same time of forming the gate lines 100 by using a single patterning process.

For example, the first bridge lines 1303 are formed in the same layer with the same material as the data lines 101. For example, the data lines 101 are made of a source-drain metal layer, and the first bridge lines 1303 are formed at the same time of forming the data lines 101 through a single pattering process.

For example, the first bridge lines 1303 extend along the second direction to electrically connect the common electrodes 10 of the adjacent sub-pixels 01 along the second direction through the first via holes 1302.

In this way, not only the common electrodes 10 of the adjacent sub-pixels 01 along the first direction are electrically connected with each other, but also the common electrodes 10 of the adjacent sub-pixels 01 along the second direction are electrically connected with each other. Thereby, the common voltage Vcom is evenly input into the common electrodes 10, so as to avoid the defects such as uneven brightness or flicker of the displayed images caused by unevenness of the common voltage Vcom.

Figure 4A:
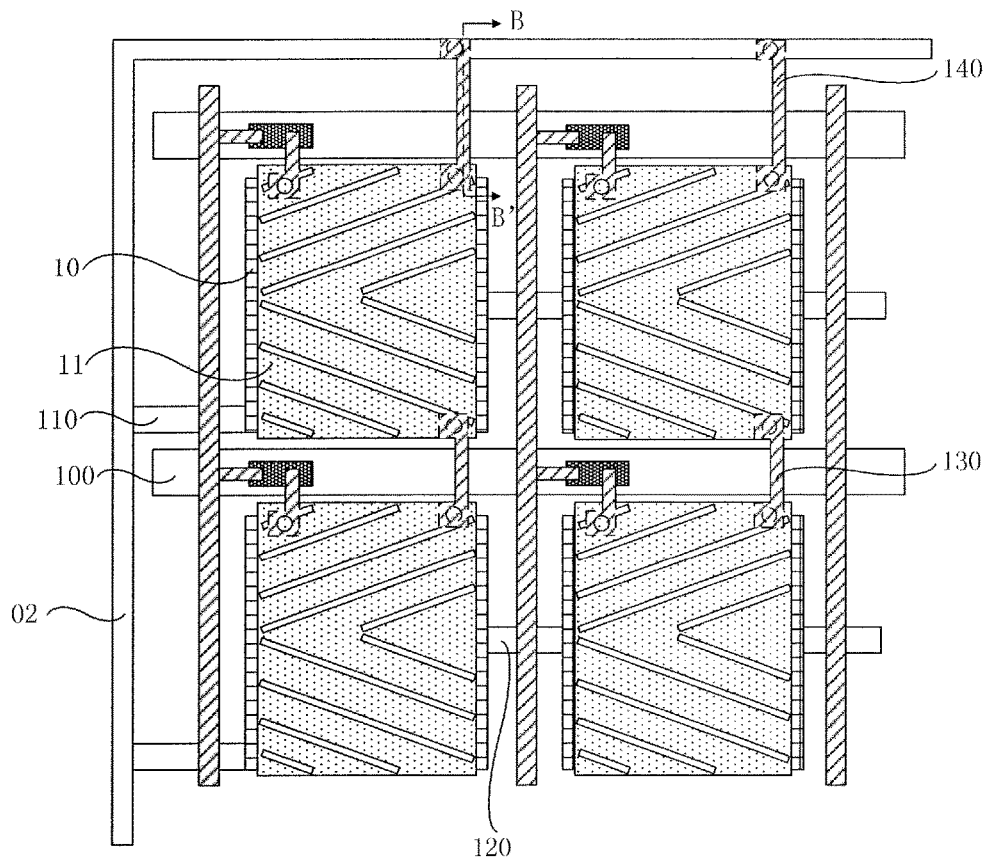
FIG. 4a is a structural schematic view illustrating still another array substrate according to the embodiments of the present disclosure.

Furthermore, as shown in FIG. 4a, the array substrate further comprises a plurality of fourth connection portions 140 extending along the second direction and provided between the peripheral common electrode line 02 and the common electrodes 10 of the sub-pixels 01 adjacent to another side of the peripheral common electrode line 02 along the first direction, so as to electrically connect the peripheral common electrode line 02 with the common electrodes 10 of the sub-pixels 01 adjacent to the another side of the peripheral common electrode line 02 along the first direction.

Similar as the third connection portions 130 as described above, the fourth connection portions 140 for example are made of a transparent conductive material.

Alternatively, in order to improve the electric conductivity of the third connection portions 140, the fourth connection portions 140 for example are made of a metal material.

Figure 4B:
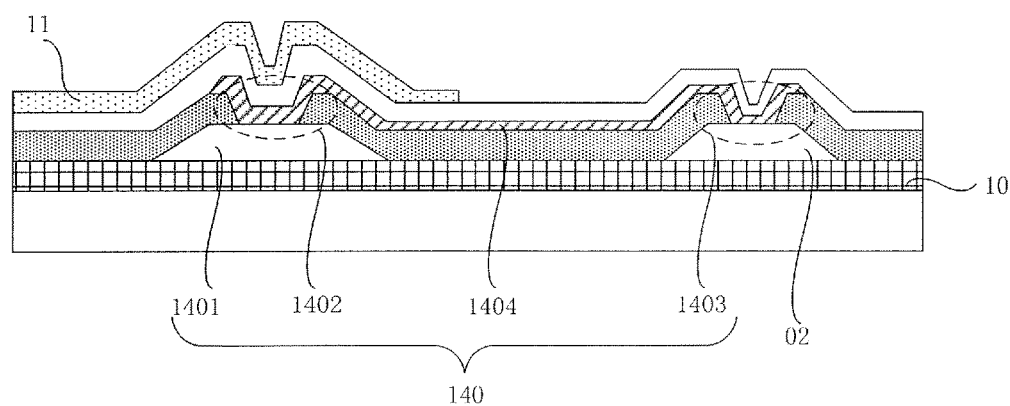
FIG. 4b is a partial structural cross-sectional view illustrating the still another array substrate according to the embodiments of the present disclosure.

For example, the array substrate comprises the data lines 101 as described above. As shown in FIG. 4b (a sectional view along B-B' of FIG. 4a), the fourth connection portions 140 for example comprise: second islands 1401, provided on the common electrodes 10 of the sub-pixels 01 adjacent to the another side of the peripheral common electrode line 02 along the first direction; second via holes 1402 provided on the second islands 1401; third via holes 1403 provided on the peripheral common electrode line 02; and second bridge lines 1404.

For example, the second islands 1401 are provided in the same layer with the same material as the gate lines 100.

For example, the second bridge lines 1404 are formed in the same layer with the same material as the data lines 101. For example, the data lines 101 are made of the source-drain metal layer, and the second bridge lines 1404 are formed at the same time of forming the data lines 101 by a single pattering process.

For example, the second bridge lines 1404 extend along the second direction to electrically connect the peripheral common electrode line 02 with the common electrodes 10 of the sub-pixels 01 adjacent to the another side of the peripheral common electrode line 02 along the first direction.

In this way, the peripheral common electrode line 02 can not only supply the common voltage Vcom to the common electrodes 10 of the sub-pixels 01 adjacent to the side of the peripheral common electrode line 02 along the second direction, but also can supply the common voltage Vcom to the common electrodes 10 of the sub-pixels 01 adjacent to the another side of the peripheral common electrode line 02 along the first direction, thereby the common voltage is more evenly input into the common electrodes 10, so as to avoid the defects such as uneven brightness or flicker of the displayed images caused by unevenness of the common voltage Vcom.

The embodiments of the present disclosure further provide a display device comprising any array substrate as described above. The display device has the same advantageous effects as the array substrate described above. Since the detailed structure and advantageous effects of the array substrate have been described in detail, they will not be repeated here.

It should be noted that, in the embodiments of the present disclosure, the display device for example is a liquid crystal display device or an organic light emitting diode display device; furthermore, the display device may be any products or parts having a display function such as liquid crystal display, a liquid crystal TV, a digital photo frame, a cell phone or a tablet PC and so on.

The embodiments of the present disclosure further provide a manufacturing method of an array substrate. The method comprises a process of forming the peripheral common electrode line 02 for supplying the common voltage Vcom and the plurality of sub-pixels 01 arranged in the matrix form. For example, the method comprises the following steps.

S101: as shown in FIG. 2, forming the first connection portions 110 which extend along the first direction (that is, the direction parallel to the gate lines 100) and are provided between the peripheral common electrode line 02 and the common electrodes 10 of the sub-pixels 01 adjacent to the side of the peripheral common electrode line 02 along the second direction, for electrically connecting the peripheral common electrode line 02 with the common electrodes 10 of the sub-pixels 01 adjacent to the side of the peripheral common electrode line 02 along the second direction.

For example, in order that the first connection portions 110 can electrically connect the peripheral common electrode line 02 with the common electrodes 10, the forming the first connection portions 110 which extend along the first direction and are provided between the peripheral common electrode line 02 and the common electrodes 10 of the sub-pixels 01 adjacent to the side of the peripheral common electrode line 02 along the second direction for example comprise: as shown in FIG. 2, forming the first connection portions 110 connected with the peripheral common electrode line 02 between the peripheral common electrode line 02 and the common electrodes 10 of the sub-pixels 01 adjacent to the side of the peripheral common electrode line 02 along the second direction.

Alternatively, in order that the first connection portions 110 can electrically connect the peripheral common electrode line 02 with the common electrodes 10, the forming the first connection portions 110 which extend along the first direction and are provided between the peripheral common electrode line 02 and the common electrodes 10 of the sub-pixels 01 adjacent to the side of the peripheral common electrode line 02 along the second direction for example comprise: as shown in FIG. 5, forming additional lines 150 connected with the peripheral common electrode line 02, the additional lines 150 extending along the second direction and provided between the peripheral common electrode line 02 and the common electrodes 10 of the sub-pixels 01 adjacent to the side of the peripheral common electrode line 02 along the second direction; and then forming the first connection portions 110 connected with the additional lines 150 between the additional lines 150 and the common electrodes 10 of the sub-pixels 01 adjacent to the additional lines 150. In this way, the purpose of electrically connecting the peripheral common electrode line 02 with the common electrodes 10 is achieved.

For example, the via holes are formed on the additional lines 150 of the adjacent sub-pixels 01 along the second direction, and the conductive connection line is formed at the via holes so that the additional lines 150 of the adjacent sub-pixels 01 along the second direction are electrically connected with each other. For example, the conductive connection line is made of a transparent conductive material or a metal material.

In addition, in order to improve electric conductivity of the first connection portions 110 and the additional lines 150, the first connection portions 110 and the additional lines 150 for example are made of a metal material. For example, the first connection portions 110 and the additional lines 150 are formed in the same layer with the same material as the gate line 100. Since the gate metal layer for forming the gate lines 100 is formed of a metal material commonly used in the art, the process for producing the first connection portions 110 and the additional lines 150 can be readily realized. Moreover, in the case that the first connection portions 110 and the additional lines 150 are formed in the same layer with the same material as the gate lines 100, the first connection portions 110 and the additional lines 150 for example are formed at the same time of forming the gate lines 100 by using a single patterning process.

It should be noted that, the common electrodes 10 and the additional lines 150 are formed respectively by using normal masks (i.e. single-tone mask) so that the common electrode 10 and the additional line 150 in the same sub-pixel 01 have no overlapping portion. In this way, the additional lines 150 will be provided in the non-display region of the sub-pixel 01, thereby increasing the aperture ratio of the display device.

What is described above is an example of the method for producing the first connection portions 110, and other producing methods will not be listed one by one here.

S102: forming the second connection portions 120 which extend along the first direction and are provided between the common electrodes 10 of the adjacent sub-pixels 01 along the first direction, for electrically connecting the common electrodes 10 of the adjacent sub-pixels along the first direction.

It should be noted that no limitation is made to the order of the above steps S101 and S102 in the embodiments of the present disclosure. Step S101 may be firstly performed and then step S102 is performed. Or, step S102 is firstly performed and then step S101 is performed. Or, steps S101 and S102 may be performed at the same time in the case that the first connection portions 110 and second connection portions 120 are made of the same material and formed in the same layer.

The embodiments of the present disclosure provide the manufacturing method of the array substrate, and the method comprises the process of forming the peripheral common electrode line for supplying the common voltage and the plurality of sub-pixels in the matrix form. The method further comprises: forming the first connection portions between the peripheral common electrode line and the common electrodes of the sub-pixels adjacent to the side of the peripheral common electrode line along the second direction (the first connection portions are provided in the non-display region of the sub-pixels), for electrically connecting the peripheral common electrode line with the common electrodes. Moreover, the second connection portions are provided between the common electrodes of the adjacent sub-pixels along the first direction (the second connection portions are provided in the non-display region of the sub-pixels), for electrically connecting the common electrodes of the adjacent sub-pixels. In this way, the common electrodes of the adjacent sub-pixels along the first direction are electrically connected through the above second connection portions, and the common electrodes adjacent to the side of the peripheral common electrode line along the second direction are electrically connected with the peripheral common electrode line by the first connection portions; so the peripheral common electrode line can provide the common voltage to all common electrodes by the first connection portions and the second connection portions to achieve the purpose of applying the common voltage to the common electrodes and controlling the deflection of liquid crystal molecules in the liquid crystal layer. Meanwhile, since both the above first connection portions and second connection portions are disposed in the non-display region of the sub-pixels, the aperture ratio of the display device will not be decreased. Accordingly, the display device formed by using the above array substrate can increase the aperture ratio and improve the product quality and display effect while applying the common voltage to the common electrodes.

The common electrodes 10 for example are made of a transparent conductive material, such as Indium Tin Oxide (ITO), Indium Zinc Oxide and the like. Since electric conductivity of the above transparent conductive material is less than that of a metal material, the first connection portions 110 and the second connection portions 120 for example are made of the metal material to improve the electric connections between the common electrodes 10 and the peripheral common electrode line 02 and the electric connections between the common electrodes 10 of adjacent sub-pixels 01. For example, the first connection portions 110 and the second connection portions 120 are formed in the same layer with the same material as the gate lines 100. Since the gate metal layer for forming the gate lines 100 is formed of the metal material commonly used in the art, the process for producing the first connection portions 110 and the second connection portions 120 can be readily realized. Moreover, in the case that the first connection portions 110 and the second connection portions 120 are formed in the same layer with the same material as the gate lines 100, the first connection portions 110 and the second connection portions 120 are formed at the same time of forming the gate lines 100 by using a single patterning process.

Figure 6A:
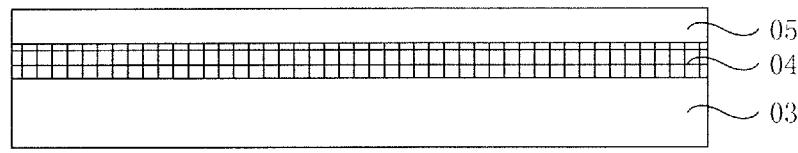
FIGS. 6a-6d are schematic views illustrating a process for forming a partial structure of an array substrate according to the embodiments of the present disclosure.

For example, in the case that the first connection portions 110, the second connection portions 120 and the gate lines 100 are formed in the same layer with the same material, the method comprise steps of:

S201: as shown in FIG. 6a, forming a common electrode layer 04 on a base substrate 03.

The common electrode layer 04 for example is made of a transparent conductive material, such as ITO. The common electrode layer 04 for example is deposited on the base substrate 03 by using a magnetron sputtering method.

S202: forming a gate metal layer 05 on the common electrode layer 04.

The gate metal layer 05 for example is formed on the common electrode layer 04 by a coating method or a magnetron sputtering method.

Figure 6B:
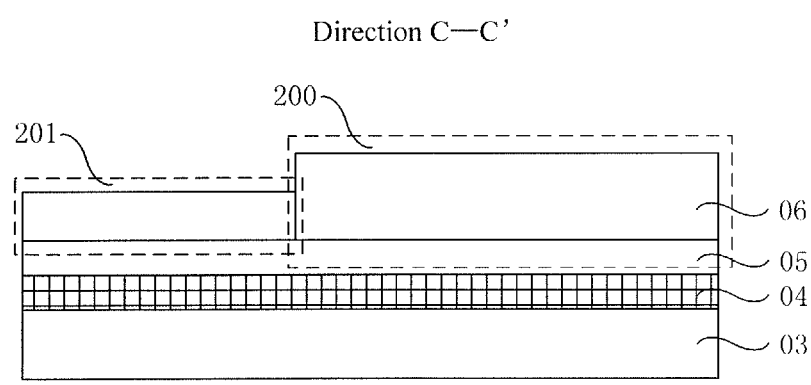
Figure 6C:
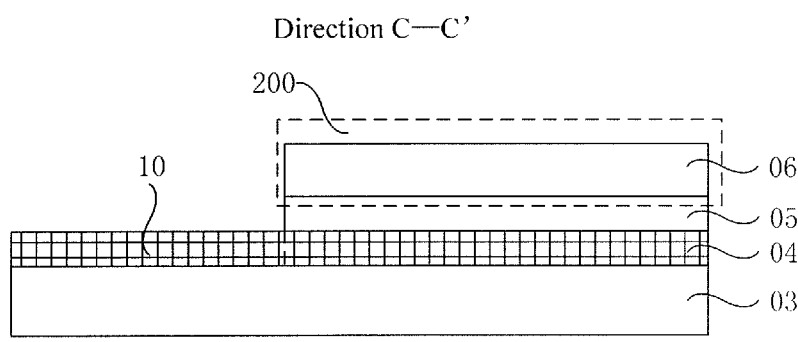
Figure 6D:
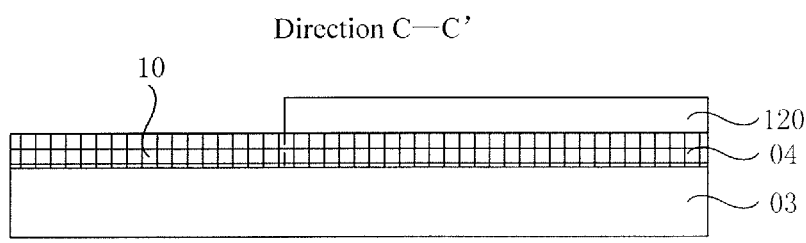

S203: as shown in FIG. 6b (it should be noted that, FIGS. 6b-6d are cross-sectional views taken along C-C' of FIG. 3a, in which the formation of the second connection portions 120 is illustrated as an example; and the formation of the first connection portions 110 is similar to the formation of the second connection portions 120), coating a layer of photoresist 06 on the gate metal layer 05, and forming a first photoresist completely reserved region 200, a first photoresist partially reserved region 201 and a first photoresist completely removed region (not shown) after one exposing and developing process by using a dual-tone mask or a single slit mask.

For example, the first photoresist completely reserved region 200 corresponds to patterns of the gate lines 100, a gate electrode (not shown) of a Thin Film Transistor (TFT), the first connection portions 110 and the second connection portions 120 to be formed. The first photoresist partially reserved region 201 corresponds to patterns of the common electrodes 10 to be formed. The first photoresist completely removed region corresponds to remaining regions.

It should be noted that, the dual-tone mask is a semi-transparent mask, which can form the photoresist with different thicknesses (the photoresist in the first photoresist completely reserved region 200 and the photoresist in the first photoresist partially reserved region 201) on the gate metal layer 05. The dual-tone mask may comprise: a gray-tone mask and a half-tone mask.

S204: etching the gate metal layer 05 and the common electrode layer 04 in the first photoresist completely removed region.

S205: as shown in FIG. 6c, removing the photoresist 06 in the first photoresist partially reserved region 201 by an ashing process, and etching the gate metal layer 05 in the first photoresist partially reserved region 201 to form the common electrodes 10. During this process, the thickness of the photoresist in the first photoresist completely reserved region 200 is thinned.

S206: as shown in FIG. 6d, stripping the photoresist 06 in the first photoresist completely reserved region 200, to finally form the gate lines 100, the gate electrode of the TFT, the first connection portions 110 (as shown in FIG. 3a) and the second connection portions 120.

As described above, the common voltage Vcom supplied by the peripheral common electrode line 02 is input into all common electrodes 10 on the array substrate by the first connection portions 110 and the second connection portions 120. However, since both the first connection portions 110 and the second connection portions 120 input the common voltage Vcom into the common electrodes 10 along the first direction, voltages input to different regions of the common electrodes 10 may be uneven. For example, voltages input to regions closer to the first connection portions 110 or the second connection portions 120 are larger while voltages input to regions farther from the first connection portions 110 or second connection portions 120 are smaller. As such, during the liquid crystal molecules are controlled to deflect, the liquid crystal molecules that should be deflected by a same angle may be defected by different angles due to unevenness of the electric field between the common electrodes 10 and the pixel electrodes 11, which therefore will cause defects such as uneven brightness or flicker of the displayed images.

In order to solve this problem, the embodiments of the present disclosure further provide technical solutions below.

For example, the above manufacturing method of the array substrate further comprises: forming a plurality of third connection portions 130 between adjacent sub-pixels 01 along the second direction, for electrically connecting the common electrodes 10 of the adjacent sub-pixels 01 along the second direction, as shown in FIG. 3a.

For example, the third connection portions 130 are made of the transparent conductive material. In the case that the third connection portions 130 are made of the transparent conductive material, the via holes (not shown in the diagram) for example are formed at positions on the pixel electrodes 11 corresponding to the third connection portions 130, and then the third connection portions 130 are made by using the transparent conductive material so that the third connection portions 130 electrically connect the common electrodes 10 of adjacent sub-pixels 01 along the second direction through the above via holes. Furthermore, since the pixel electrodes 11 are also made of the transparent conductive material, the insulating layer is formed between the third connection portions 130 and the pixel electrodes 11. Furthermore, in order to prevent the pixel electrodes from being electrically connected with the third connection portions 130 at the via holes, portions of the pixel electrodes around the via holes are removed.

Alternatively, in order to improve the electric conductivity of the third connection portions 130, the third connection portions 130 are made of the metal material. For example, the array substrate comprises the data lines 101 as described above, the forming the third connection portions 130 comprises steps of:

S301: forming the first islands 1301 in the same layer with the same material as the gate lines 100 on the common electrodes 10 of the adjacent sub-pixels 01 along the second direction;

S302: forming the first via holes 1302 on the first islands 1301;

S303: forming the first bridge lines 1303 in the same layer with the same material as the data lines 101 on the first via holes 1302.

The first islands 1301, the first via holes 1302 and the first bridge lines 1303 constitute the third connection portions 130. The first bridge lines 1303 extend along the second direction to electrically connect the common electrodes 10 of the adjacent sub-pixels 01 along the second direction through the first via holes 1302.

In this way, not only the common electrodes 10 of the adjacent sub-pixels 01 along the first direction are electrically connected with each other, but also the common electrodes 10 of the adjacent sub-pixels 01 along the second direction are electrically connected with each other. Thereby, the common voltage Vcom is evenly input into the common electrodes 10, so as to avoid the defects such as uneven brightness or flicker of the displayed images caused by unevenness of the common voltage Vcom.

Figure 7A:
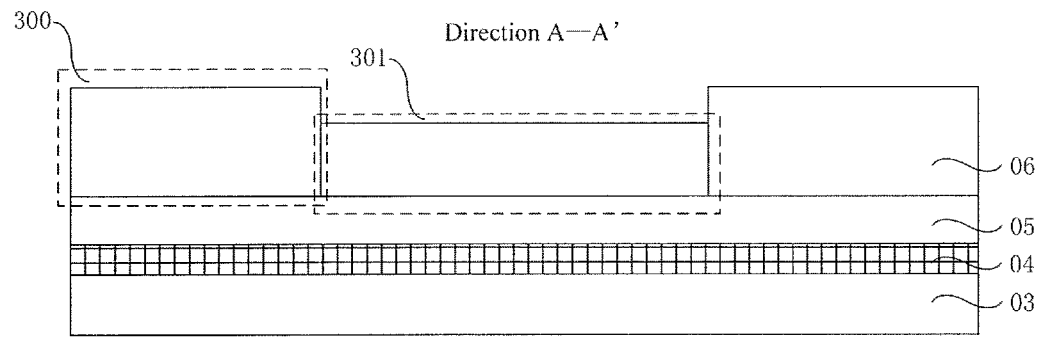
FIGS. 7a-7h are schematic views illustrating a process for forming a partial structure of another array substrate according to the embodiments of the present disclosure.
Figure 7B:
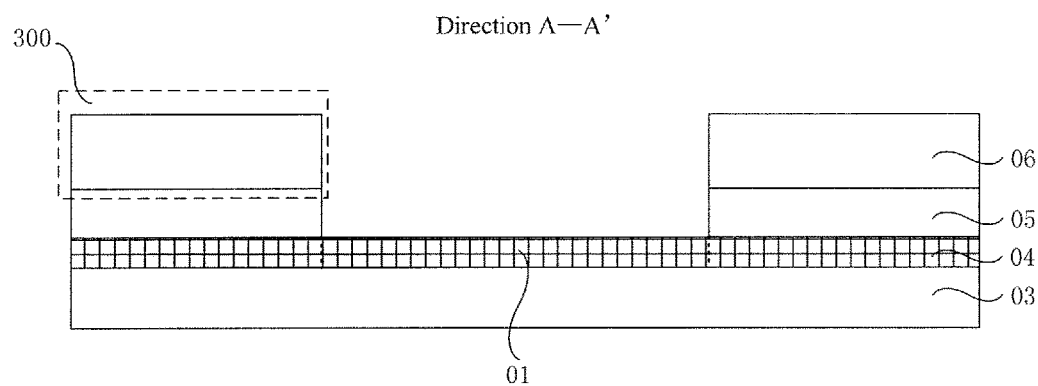
Figure 7C:
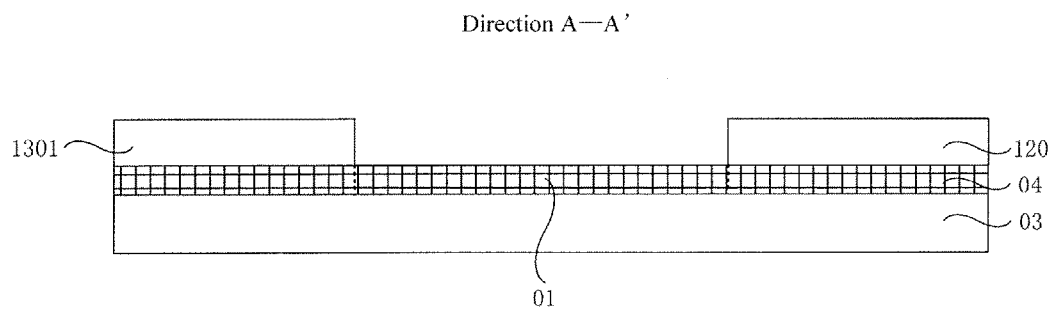
Figure 7D:
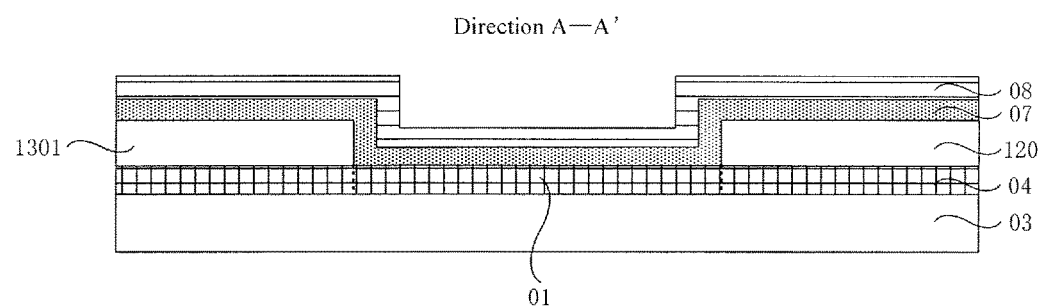

After the above step S202, the forming the third connection portions 130 for example comprises:

Firstly, as shown in FIG. 7a (wherein, FIGS. 7b-7d are cross-sectional views taken along A-A' of FIG. 3a, in which the first connection portions 110 are not illustrated; however, the first connection portions 110 are formed similarly), coating a layer of photoresist 06 on the gate metal layer 05, and forming a second photoresist completely reserved region 300, a second photoresist partially reserved region 301 and a second photoresist completely removed region (not shown) after one exposure and developing process by using a dual-tone mask or a single slit mask.

For example, the second photoresist completely reserved region 300 corresponds to patterns of the gate lines 100, the gate electrode of the TFT, the first connection portions 110, the second connection portions 120 and the first islands 1301 to be formed. The second photoresist partially reserved region 301 corresponds to patterns of the common electrodes 10 to be formed. The second photoresist completely removed region corresponds to remaining regions.

Next, etching the gate metal layer 05 and the common electrode layer 04 in the second photoresist completely removed region.

Next, as shown in FIG. 7b, removing the photoresist 06 in the second photoresist partially reserved region 301 by an ashing process, and etching the gate metal layer 05 in the second photoresist partially reserved region 301 to form the common electrodes 10. During this process, the thickness of the photoresist in the second photoresist completely reserved region 300 is thinned.

Next, as shown in FIG. 7c, stripping the photoresist in the second photoresist completely reserved region 300, to finally form the gate lines, the gate electrode of the TFT, the first connection portions 110, the second connection portions 120 and the first islands 1301.

Next, as shown in FIG. 7d, forming a gate insulating layer 07 on the substrate with the above structures.

Next, forming an active layer 08 on the gate insulating layer 07. For example, the active layer 08 is formed by an a-Si layer and an n+ a-Si layer. For example, the a-Si layer is formed by reactant gases $SiH_4$ and $H_2$ by using a Plasma Enhanced Chemical Vapor Deposition (PECVD) method; then the n+ a-Si layer is formed by reactant gases $SiH_4$ and $PH_3$ by using the PECVD method. In this way, since the n+ a-Si layer is a phosphorus-doped semiconductor and has high conductivity, the resistance between the active layer 8 and the source-drain metal layer formed on the active layer 8 in a subsequent step can be reduced.

In addition, the active layer 08 for example is made of an oxide semiconductor material, such as Indium Gallium Zinc Oxide (IGZO). In the case that the active layer 08 is made of the oxide semiconductor material, since the oxide semiconductor material is sensitive to oxygen or hydrogen ions and will be influenced during the source-drain metal layer on the active layer 08 is wet-etched, an Etch Stopper Layer (ESL) needs to be made on the oxide semiconductor material to protect the oxide semiconductor material.

Figure 7E:
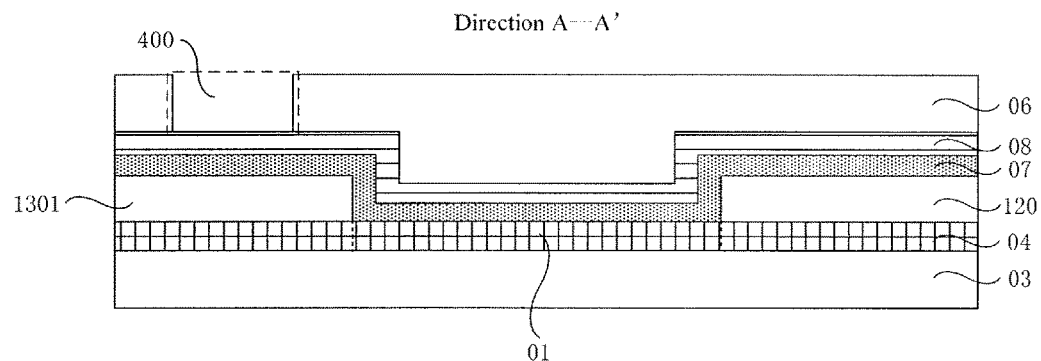

Next, as shown in FIG. 7e, coating a layer of photoresist 06 on the active layer 08, and forming a third photoresist completely reserved region (not shown), a third photoresist partially reserved region (not shown) and a third photoresist completely removed region 400 after one exposing and developing process.

For example, the third photoresist completely reserved region corresponds to patterns of a semiconductor active layer of the TFT to be formed. The third photoresist completely removed region 400 corresponds to patterns of the first via holes 1302 to be formed. The third photoresist partially reserved region corresponds to remaining regions.

Figure 7F:
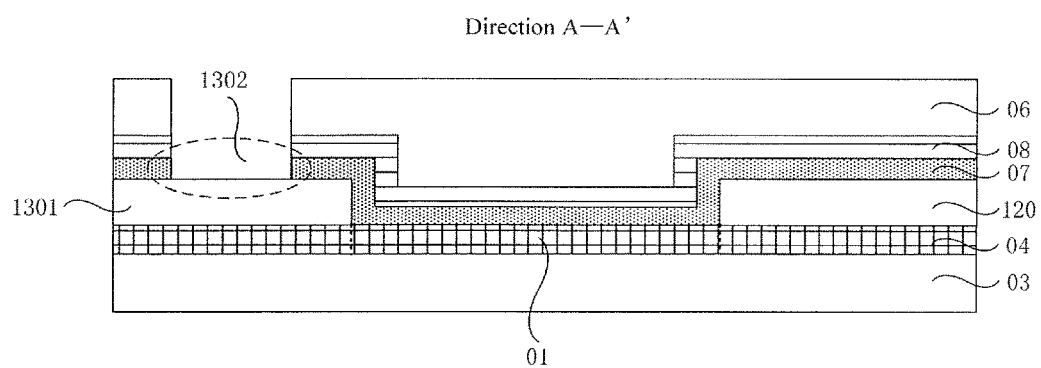

Next, as shown in FIG. 7f, etching the active layer 08 and the gate insulating layer 07 in the third photoresist completely removed region 400. The gate metal layer 07 is exposed to form the first via holes 1302.

Figure 7G:
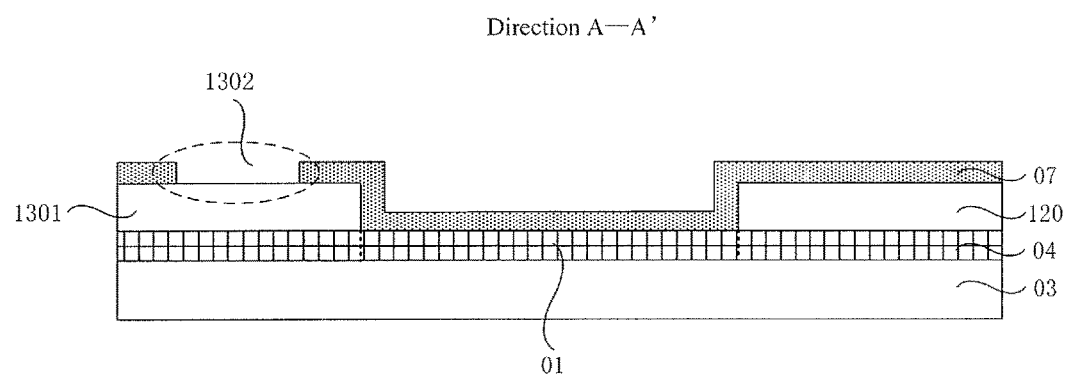

Next, as shown in FIG. 7g, removing the photoresist 06 in the third photoresist partially reserved region by an ashing process, and etching the active layer 08 in the third photoresist partially reserved region 400 for example by dry etching process to expose the gate insulating layer film 07. Finally, stripping the photoresist in the third photoresist completely reserved region to form the semiconductor active layer of the TFT.

Figure 7H:
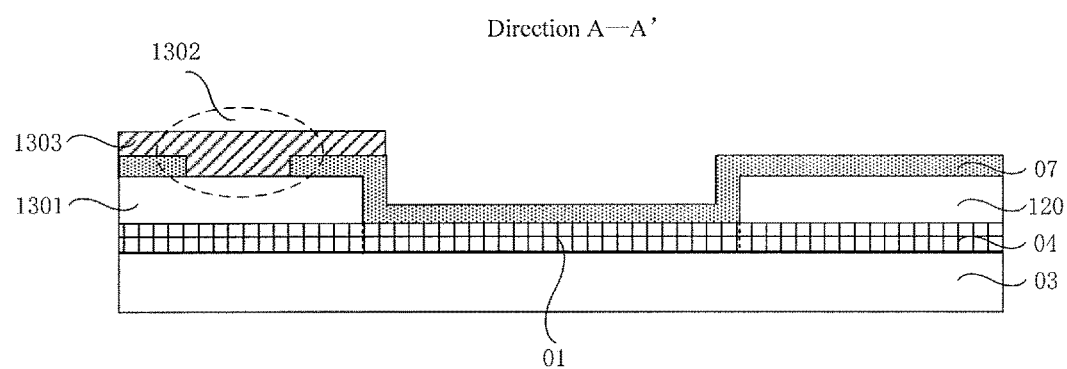

Finally, as shown in FIG. 7h, forming a source-drain metal layer on the substrate with the above structures, and forming source electrode, drain electrode (not shown) of the TFT, the data lines 101 and the first bridge lines 1303 through a single patterning process.

Furthermore, the manufacturing method of the array substrate for example further comprises: forming a plurality of fourth connection portions 140 which extend along the second direction and provided between the peripheral common electrode line 02 and the common electrodes 10 of the sub-pixels 01 adjacent to another side of the peripheral common electrode line 02 along the first direction, for electrically connecting the peripheral common electrode line 02 with the common electrodes 10 of the sub-pixels 01 adjacent to the another side of the peripheral common electrode line 02 along the first direction.

Similar to the third connection portions 130, the fourth connection portions 140 for example are made of the transparent conductive material.

Alternatively, in order to improve the electric conductivity of the fourth connection portions 140, the fourth connection portions 140 for example are made of the metal material. For example, the array substrate comprises the data lines 101 as described above, the forming the fourth connection portions 140 comprises steps of.

S401: forming the second islands 1041 in the same layer with the same material as the gate lines 100 on the common electrodes 10 of the sub-pixels 01 adjacent to the another side of the peripheral common electrode line 02 along the first direction.

S402: forming the second via holes 1042 on the second islands 1041.

S403: forming the third via holes 1043 on the peripheral common electrode line 02.

S404: forming the second bridge lines 1044 in the same layer with the same material as the data lines 101 on the second via holes 1042 and third via holes 1043.

For example, the second islands 1041, the second via holes 1042, the third via holes 1043 and the second bridge lines 1404 constitute the fourth connection portions 140. The second bridge lines 140 extend along the second direction and electrically connect the peripheral common electrode line 02 and the common electrodes 10 of the sub-pixels 01 adjacent to the another side of the peripheral common electrode line 02 along the first direction through the second via holes 1042 and third via holes 1043.

The process of forming the fourth connection portions 140 is similar to the process of forming the third connection portions 130, which will not be repeated here.

In this way, the peripheral common electrode line 02 can not only supply the common voltage Vcom to the common electrodes 10 of the sub-pixels 01 adjacent to the side of the peripheral common electrode line 02 along the second direction, but also can supply the common voltage Vcom to the common electrodes 10 of the sub-pixels 01 adjacent to the another side of the peripheral common electrode line 02 along the first direction, thereby the common voltage is more evenly input into the common electrodes 10, so as to avoid the defects such as uneven brightness or flicker of the displayed images caused by unevenness of the common voltage Vcom.

The foregoing embodiments merely are exemplary embodiments of the disclosure, and not intended to define the scope of the disclosure, and the scope of the disclosure is determined by the appended claims.

The present application claims priority of Chinese Patent Application No. 201410431286.9 filed on Aug. 28, 2014, the disclosure of which is incorporated herein by reference in its entirety as part of the present application.

What is claimed is:

1. A manufacturing method of an array substrate, comprising a process of forming a peripheral common electrode line for supplying a common voltage and a plurality of sub-pixels,
   wherein the method further comprises:
   forming first connection portions which extend along a first direction and are provided between the peripheral common electrode line and common electrodes of the sub-pixels adjacent to a side of the peripheral common electrode line along a second direction, for electrically connecting the peripheral common electrode line with the common electrodes of the sub-pixels adjacent to the side of the peripheral common electrode line along the second direction; and
   forming second connection portions which extend along the first direction and are provided between the common electrodes of adjacent sub-pixels along the first direction, for electrically connecting the common electrodes of the adjacent sub-pixels along the first direction;
   wherein the forming the first connection portions which extend along the first direction and are provided between the peripheral common electrode line and the common electrodes of the sub-pixels adjacent to the side of the peripheral common electrode line along the second direction comprises:
   forming additional lines connected with the peripheral common electrode line, the additional lines extending along the second direction and provided between the peripheral common electrode line and the common electrodes of the sub-pixels adjacent to the side of the peripheral common electrode line along the second direction;
   forming the first connection portions connected with the additional lines between the additional lines and the common electrodes of the sub-pixels adjacent to the side of the additional lines along the second direction.

2. The manufacturing method of the array substrate according to claim 1, wherein,
   the array substrate further comprises gate lines,
   the first connection portions and the second connection portions are formed in a same layer with a same material as the gate lines.

3. The manufacturing method of the array substrate according to claim 1, wherein, the additional lines are provided in a non-display region of the array substrate.

4. An array substrate, comprising a peripheral common electrode line for supplying a common voltage and a plurality of sub-pixels, wherein,
   the array substrate further comprises a plurality of first connection portions and second connection portions;
   the first connection portions extend along a first direction and are provided between the peripheral common electrode line and common electrodes of the sub-pixels adjacent to a side of the peripheral common electrode line along a second direction, for electrically connecting the peripheral common electrode line with the common electrodes of the sub-pixels adjacent to the side of the peripheral common electrode line along the second direction;
   the second connection portions extend along the first direction and are provided between the common electrodes of adjacent sub-pixels along the first direction, for electrically connecting the common electrodes of the adjacent sub-pixels along the first direction; and the first connection portions are separated from each other and the second connection portions are separated from each other so that no continuous common electrode line for supplying the common voltage and extended along the first direction is provided within a display region of the array substrate.

5. An array substrate, comprising a peripheral common electrode line for supplying a common voltage and a plurality of sub-pixels, wherein,
the array substrate further comprises a plurality of first connection portions and second connection portions;
the first connection portions extend along a first direction and are provided between the peripheral common electrode line and common electrodes of the sub-pixels adjacent to a side of the peripheral common electrode line along a second direction, for electrically connecting the peripheral common electrode line with the common electrodes of the sub-pixels adjacent to the side of the peripheral common electrode line along the second direction;
the second connection portions extend along the first direction and are provided between the common electrodes of adjacent sub-pixels along the first direction, for electrically connecting the common electrodes of the adjacent sub-pixels along the first direction; and
each of the common electrodes of the sub-pixels adjacent to the side of the peripheral common electrode line is electrically connected with both one of the first connection portions and one of the second connection portions, and the peripheral common electrode line, the one of the first connection portions and the one of the second connection portions are arranged sequentially along the first direction.

6. The array substrate according to claim 5, wherein,
the array substrate further comprises additional lines which extend along the second direction, are provided between the peripheral common electrode line and the common electrodes of the sub-pixels adjacent to the side of the peripheral common electrode line along the second direction and are connected with the peripheral common electrode line; and
the first connection portions are connected with the additional lines.

7. The array substrate according to claim 6, wherein, the additional lines are provided in a non-display region of the array substrate.

8. The array substrate according to claim 5, wherein,
the array substrate further comprises gate lines, and the first connection portions and the second connection portions are formed in a same layer with a same material as the gate lines.

9. The array substrate according to claim 5, wherein,
a width of each of the first connection portions along the second direction and/or a width of each of the second connection portions along the second direction are $\frac{1}{40}$-$\frac{1}{15}$ of a width of each of the sub-pixels along the second direction.

10. A display device, comprising the array substrate according to claim 5.

* * * * *